(12) United States Patent
Miura et al.

(10) Patent No.: US 7,320,099 B2
(45) Date of Patent: Jan. 15, 2008

(54) METHOD AND APPARATUS FOR GENERATING ERROR CORRECTION DATA, AND A COMPUTER-READABLE RECORDING MEDIUM RECORDING AN ERROR CORRECTION DATA GENERATING PROGRAM THEREON

(75) Inventors: Tsuyoshi Miura, Kawasaki (JP); Noriyuki Ihara, Kawasaki (JP); Shin Fujita, Kawasaki (JP); Akira Nakagawa, Kawasaki (JP); Atsushi Ichiki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 602 days.

(21) Appl. No.: 10/994,343

(22) Filed: Nov. 23, 2004

(65) Prior Publication Data

US 2006/0048036 A1   Mar. 2, 2006

(30) Foreign Application Priority Data

Aug. 25, 2004   (JP) .............................. 2004-245112

(51) Int. Cl.
*G08C 25/02*   (2006.01)
*G08C 25/04*   (2006.01)
(52) U.S. Cl. ...................................... 714/748; 714/751
(58) Field of Classification Search ...................... None
See application file for complete search history.

(56) References Cited

U.S. PATENT DOCUMENTS 5,526,399 A   6/1996 Kameda ...................... 379/58
5,737,744 A * 4/1998 Callison et al. ............. 711/114
6,145,017 A * 11/2000 Ghaffari ........................ 710/5

FOREIGN PATENT DOCUMENTS

| JP | 7-67175 | 3/1995 |
| JP | 2002-9883 | 1/2002 |
| JP | 2002344437 A * | 11/2002 |

OTHER PUBLICATIONS

Stutzman, Data Communication Control Procedures, ACM Computing Surveys, vol. 4, Issue 4, Dec. 1972, ACM Press, pp. 197-220.*
H. Schulzrinne, et al., "RTP:A Transport Protocol For Real-Time Applications", Jan. 1996, URL:http://www.ietf.org/rfc/rfc1889.txt.
J. Rosenberg, et al., "An RTP Payload Format For Generic Forward Error Correction", Dec. 1999, URL:http://www.ietf.org/rfc/rfc2733.txt.

* cited by examiner

*Primary Examiner*—Cynthia Britt
*Assistant Examiner*—Dipakkumar Gandhi
(74) *Attorney, Agent, or Firm*—Staas & Halsey LLP

(57) ABSTRACT

When error correction data, which is to be inserted into transmission data at specific intervals, is generated by calculating exclusive-OR of the transmission data, cumulative exclusive-OR of the transmission data is continuously calculated independent of the error correction data insertion intervals. Exclusive-OR between a calculation of the exclusive-OR at the time of the previous error correction data insertion and a calculation of the exclusive-OR at the time of the current error correction data insertion is calculated, thereby generating error correction data to be inserted at the present time. This provides efficient error correction data calculation.

9 Claims, 9 Drawing Sheets

METHOD AND APPARATUS FOR GENERATING ERROR CORRECTION DATA, AND A COMPUTER-READABLE RECORDING MEDIUM RECORDING AN ERROR CORRECTION DATA GENERATING PROGRAM THEREON

CROSS REFERENCE TO RELATED APPLICATIONS

This application is based on and hereby claims priority to Japanese Patent Application No. 2004-245112 filed on Aug. 25, 2004, the contents of which are hereby incorporated by reference.

BACKGROUND OF THE INVENTION

1. Field of the Invention

The present invention relates to a method and an apparatus for generating error correction data. The invention also relates to a computer-readable recording medium recording an error correction data generating program thereon. The invention relates particularly to a technique suitable for use in increasing resistance to errors in data transmission, such as streaming data transmission over a communication network (the Internet or the like) in which packet loss frequently occurs.

2. Description of the Related Art

Recently, there have been demands for data communication, such as video data communication and audio data communication, which is performed via various types of communication means such as the Internet. In particular, as a recent data communication service, streaming data distribution on the Internet has been increasingly used. In the streaming distribution, while data is being transmitted from an MPEG (Motion Picture Experts Group) encoder apparatus (hereinafter will be simply called the "encoder") to an MPEG decoder apparatus (hereinafter will be simply called the "decoder"), received data is replayed in real time. Examples of such data streaming transmission-employed systems are VOD (Video On Demand) systems, streaming distribution systems which distribute live videos, and videoconference systems.

The RTP (Real-time Transport Protocol) [see the following non-patent document 1 (IETF RFC1889)] is one of the Internet technologies which are suitable for use in such real-time communication. In RTP data communications, packets are given time stamps as time information. The time stamp is used by an encoder apparatus on the packet sender end and a decoder apparatus on the packet receiver end to acknowledge the time relationship, whereby the decoder apparatus is capable of performing synchronous replay, without being affected by delay in packet transmission or jitter. However, since RTP does not guarantee real-time data communication, there is a possibility that distribution delay and packet loss occurs in RTP packet transmission.

However, under such a state, the decoder apparatus is still capable of replaying data by using packets that have arrived during an expected time duration. Even if some data loss (packet loss) occurs in video data and audio data, it is still possible to perform low-quality replay of the data or to perform data replay while adding some data correction. In such a case, packets transmitted after some delay or packets in which an error occurs are discarded on the decoder apparatus. That is, even when high-quality data distribution processing is performed, if packet loss or an error occurs, data cannot be replayed in high quality on the decoder apparatus.

As a procedure for solving such a problem of RTP data transmission, TCP (Transmission Control Protocol), which is reliable in data transmission, is used for realizing issuance of packet retransmission requests and retransmission of the requested packets. However, although TCP is efficient in error correction, it has problems of low throughput and large delay. Hence, if the requested packets are retransmitted, it is probable that the packets cannot reach the destination in time. Accordingly, the use of TCP is not sufficient to realize a real-time communication system.

Further, as an error correction method which copes with the packet loss problem, the technique of FEC [Forward Error Correction; see the following non-patent document 2 (IETF RFC2733)] has been developed. FIG. 8 illustrates the FEC error correction method. As shown in FIG. 8, in FEC, a redundant packet (parity) P1, which is error correction data generated on the encoder apparatus 100 using exclusive-OR (XOR) operation, is transmitted together with transmission data (packets) D1 and D2. If a packet is lost over the network 300, in this case the Internet, the decoder apparatus 200 is capable of restoring the lost packet, D1 or D2, so that the lost packet need not be retransmitted from the encoder apparatus 100.

In this manner, FEC provides a reliable media transmission with high interactivity even in network circumstances, such as the Internet, in which packet loss can frequently occur, thereby realizing a service such as the Internet live broadcast. However, in network circumstances in which packet loss bursts appear, it is difficult to provide high-quality media transmission.

Against such a backdrop, the technique of ARQ (Automatic Repeat Request) is developed to cope with such packet loss bursts. FIG. 9 illustrates the ARQ error correction method. As shown in FIG. 9, in ARQ, if a packet loss is detected on decoder apparatus 500, a retransmission request for the lost packet is transmitted to encoder apparatus 400 (see arrow 600), and the encoder apparatus 400 resends the lost packet (see arrow 700).

In the previous systems, either of the FEC technique and the ARQ technique is normally used without switching therebetween. For example, the FEC technique is effective in network circumstances where the transmission rate is low and the error rate is high. On the other hand, in network circumstances where the transmission rate is high and the error rate is low, FEC packet overhead is increased, thereby affecting the transmission efficiency. In contrast to this, the ARQ technique is effective in network circumstances where the transmission rate is high and the error rate is low. On the other hand, in network circumstances where the transmission rate is low and the error rate is high, data exchange relating to packet retransmission is increased, so that the transmission efficiency is affected.

Against such backdrops, techniques in which the ARQ technique and the FEC technique are combined have been developed. For example, the following patent application 1 (Japanese Patent Application Publication No. 2002-9883) and patent application 2 (Japanese Patent Application Publication No. HEI 7-67175) are examples of such techniques.

Patent Application 1 discloses a technique of automatically switching error correction methods by using specific parameters (error rate and transmission rate) to correct errors due to communication data transmission error which occurs over communication network systems. More specifically, received data is decoded to calculate the parameters (error rate/transmission rate), and if the parameters do not exceed their threshold values, the ARQ technique is automatically selected. On the other hand, if the parameters exceed the threshold values, the FEC is automatically selected. With this arrangement, according to the state of the data transmission rate and the transmission efficiency, the most efficient error correction method is automatically selected, and network traffic load can be decreased (see paragraph 0021 through 0023 of Patent Application 1).

Patent application 2 provides a data transmission technique that is most efficient in transmission, by changing the transmission rate according to the line condition of a radio communication division that is not always stable, thereby selecting either or both of the FEC and ARQ techniques. For realizing this, the technique monitors the line condition (error occurrence condition) of the radio communication division, and the transmission rate is varied depending on the error occurrence condition, and either of the ARQ and FEC techniques is selected/decided as an error control method to be applied.

More precisely, if the transmission rate is 9600 bps, the ARQ is employed. If the transmission rate is 4800 bps or 2400 bps, whether correction by the FEC technique is available is evaluated. If the correction is available, self correction is performed. If the correction is unavailable where the transmission rate is 4800 bps, an ARQ retransmission request is issued. In addition, the number of times the retransmission is performed is monitored, and if the number is large, which means line quality is low, the transmission rate is decreased to 4800 bps, and the ARQ and FEC techniques are concurrently used. When the transmission rate is 4800 bps, if the number of times the retransmission is performed is increased, which means line quality is further decreased, the transmission rate is decreased to 2400 bps, and the FEC mode is selected (see paragraph 0014 and 0015 of Patent Application 2).

In the technique of Patent Application 2, control methods appropriate for the data transmission rate and the transmission rate are selected according to the line condition, so that the most efficient transmission rate can be selected.

[Patent Application 1] Japanese Patent Application Publication No. 2002-9883

[Patent Application 2] Japanese Patent Application Publication No. HEI 7-67175

[Non-Patent Document 1] H. Schulzrinne, et al., "RTP: A Transport Protocol for Real-Time Applications", Request for Comments: 1889, [online], January, 1996, IETF Network Working Group, [retrieved on Aug. 25, 2004], the Internet <URL: http://www.ietf.org/rfc/rfc1889.txt>

[Non-Patent Document 2] J. Rosenberg, et al., "An RTP Payload Format for Generic forward Error Correction", Request for comments: 2733, [online], December, 1999, IETF Network Working Group, [retrieved on Aug. 25, 2004], the Internet <URL: http://www.ietf.org/rfc/rfc2733.txt>

The previous systems have the following problems. Although the previous techniques are capable of performing efficient error correction with a single encoder and a single decoder being employed, the systems do not pay consideration to systems where a single encoder distributes video data to two or more decoders.

That is, provided that intervals at which redundant packets are inserted are the same among all of the decoders, and that all the decoders belong to the same network, and that the number of times a retransmission request is transmitted is almost equal among the decoders, error correction and suppression of fluctuation of the data transmission band are realized as efficiently as the system in which only one encoder and one decoder are employed. However, provided that some or all of the decoders belong to different networks, and that the quality of one of the networks is low so that the number of retransmission requests issued by a decoder belonging to the low-quality network is particularly increased, the data transmission band for the decoder is increased, thereby affecting the band of the network.

Further, provided that the redundant packet insertion intervals differ among the decoders, depending on the quality of the networks to which the decoders belong, the encoder needs to generate (exclusive-OR operation) different redundant packets for different decoders, so that load on the encoder is increased.

Here, it is conceivable to insert redundant packets at the same intervals for all of the decoders. At this time, the interval is adjusted to one decoder in which errors occur most frequently. In that case, redundant packets are inserted at long intervals for the other decoders in spite of the fact that errors occur less frequently in the transmission data sent to these decoders. It is sometimes considered that such increased redundant packet insertion intervals would cause no problem because errors rarely occur. However, since the FEC technique is forward prediction, which has a strong preventative aspect against errors, the FEC technique cannot cope with suddenly increased loss which can be caused at some timings.

Further, if the insertion interval of redundant packets for other decoders is changed so as to agree with the insertion interval of a specific decoder, not only load on the encoders is increased, but also the insertion intervals for those decoders are changed, so that desired error correction is unavailable. In addition, the change in insertion intervals of the redundant packets will change the transmission rate, so that another communication system (TCP, etc.) in the network begins using that band, thereby reducing the usable bands for streaming. The necessary band is thus preferably used all the time.

SUMMARY OF THE INVENTION

With the foregoing problems in view, it is an object of the present invention to make it possible to realize efficient error correction in systems in which one data sender apparatus (encoder) distributes data to two or more data receiver apparatus (decoders). The invention provides efficient calculation of error correction data for the individual decoders.

In order to accomplish the above object, according to the present invention, there is provided an error correction data generating method for generating error correction data, which is to be inserted into transmission data at specific insertion intervals, by calculating exclusive-OR of the transmission data, the method comprising: cumulatively calculating exclusive-OR of the transmission data, the calculation being continuously performed independent of the insertion intervals; and computing exclusive-OR between a calculation of the exclusive-OR obtained at the previous insertion occasion of the error correction data and a calculation of the exclusive-OR obtained at the scheduled time of the current insertion of the error correction data, to generate error correction data to be inserted at the present insertion occasion.

As one preferred feature, when the transmission data is sent to a plurality of data receiver apparatus, and when the error correction data is inserted into the transmission data at insertion intervals unique to each of the destination receiver apparatus, a calculation of the exclusive OR obtained at the previous insertion occasion is stored separately for each of the plural data receiver apparatus. For each of the plural data receiver apparatus, exclusive-OR between the calculation of the exclusive-OR obtained at the previous insertion occasion of the error correction data and a calculation of the exclusive-OR obtained at the scheduled time of the current insertion of the error correction data, is computed to generate error correction data to be inserted at the present insertion occasion.

As a generic feature, there is provided an error correction data generating apparatus for generating error correction data, which is to be inserted into transmission data at specific insertion intervals, by calculating exclusive-OR of the transmission data, the apparatus comprising: an exclusive-OR cumulative calculation unit which cumulatively calculates exclusive-OR of the transmission data, the calculation being continuously performed independent of the insertion intervals; a storing means which stores a calculation obtained by the exclusive-OR cumulative calculation unit at the previous data insertion occasion, and an exclusive-OR insertion time point computing means which computes exclusive-OR between a calculation obtained by the exclusive-OR cumulative calculation unit at the scheduled time of the current insertion of the error correction data and the calculation which is obtained at the previous insertion occasion of the error correction data and is stored in the storing means, to generate error correction data to be inserted at the present insertion occasion.

As another generic feature, there is provided a computer-readable recording medium in which is recorded a program for instructing a computer to generate error correction data, which is to be inserted into transmission data at specific insertion intervals, by calculating exclusive-OR of the transmission data, the program instructing the computer to execute the steps of: cumulatively calculating exclusive-OR of the transmission data, the calculation being continuously performed independent of the insertion intervals; and computing exclusive-OR between a calculation of the exclusive-OR obtained at the previous insertion occasion of the error correction data and a calculation of the exclusive-OR obtained at the scheduled time of the current insertion of the error correction data, to generate error correction data to be inserted at the present insertion occasion.

According to the present invention, exclusive-OR of transmission data is cumulatively calculated independent of error correction data insertion intervals, and exclusive-OR of a calculation of the exclusive-OR at the time of the previous error correction data insertion and a calculation of the exclusive-OR at the scheduled time of the current error correction data insertion is calculated. This provides efficient calculation of such error correction data independently of difference and changes in insertion intervals of the data, so that load of the calculation is greatly reduced, and efficient error correction is realized.

In particular, even when data is transmitted to two or more destinations (data receiver apparatus), exclusive-OR between a calculation of the exclusive-OR at the time of the previous error correction data insertion and a calculation of the exclusive-OR at the scheduled time of the current error correction data insertion is obtained for each data receiver apparatus, whereby error correction data to be inserted at the present time into data which is transmitted to each data receiver apparatus that is receiving the data is easily generated. Thus, it is not necessary to cumulatively calculate exclusive-OR depending on different insertion intervals of different data receiver apparatus, so that the present invention is greatly effective.

Other objects and further features of the present invention will be apparent from the following detailed description when read in conjunction with the accompanying drawings.

DESCRIPTION OF THE PREFERRED EMBODIMENT(S)

[A] One Preferred Embodiment

Figure 1:
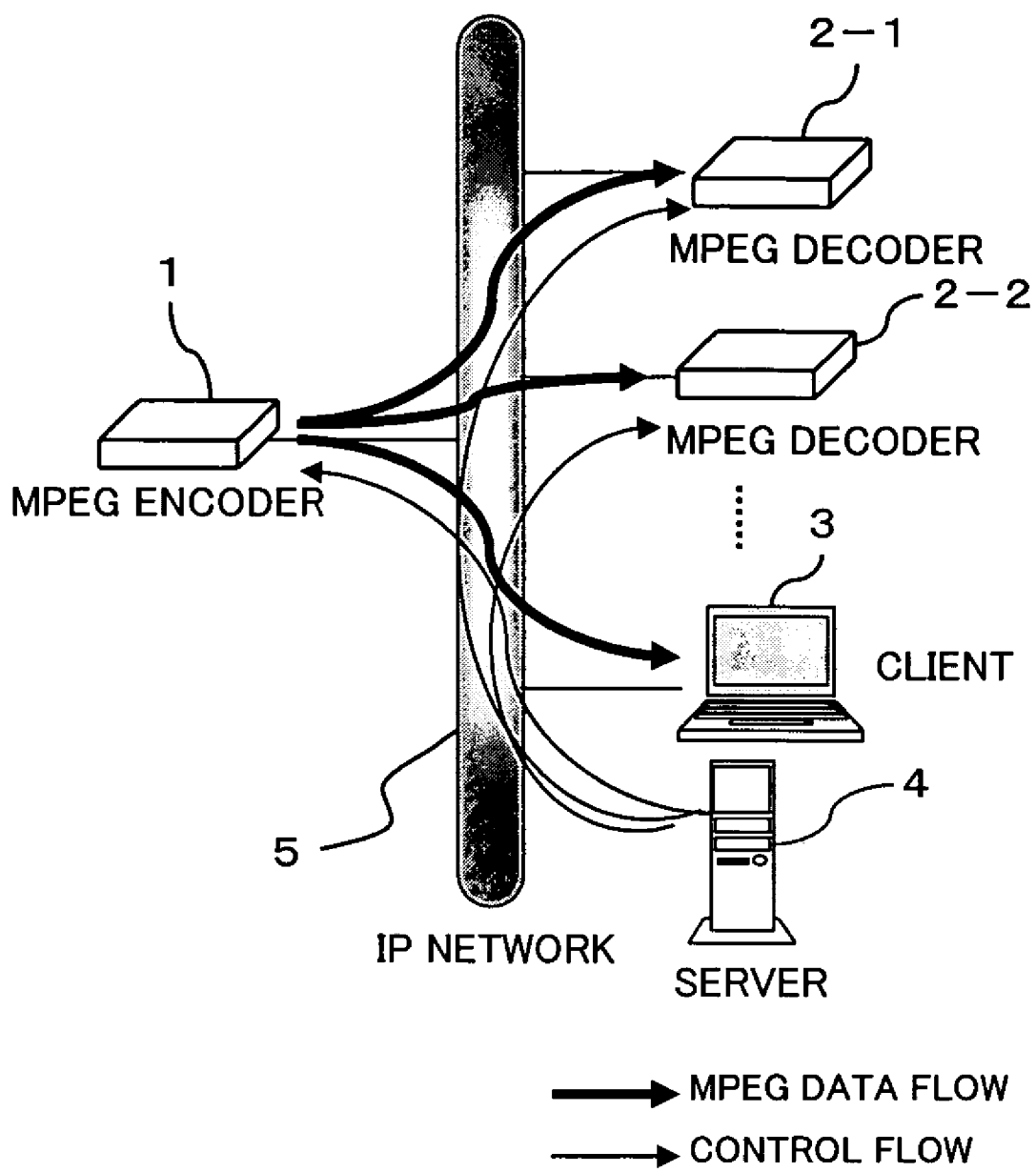
FIG. 1 is a block diagram showing a construction of an video (video) distribution system according to one preferred embodiment of the present invention.

FIG. 1 is a block diagram showing a construction of an video (video) distribution system according to one preferred embodiment of the present invention. As shown in FIG. 1, the video distribution system of the present embodiment includes: MPEG encoder (data sender apparatus) 1 which makes live transmission of MPEG streaming data in packets through network 5, an IP (Internet Protocol) network with a high error rate; MPEG decoders data receiver apparatus) 2-1, 2-2, . . . and/or a client terminal (data receiver apparatus) 3 which receives, decodes, and displays the streaming data (packets) transmitted by the MPEG encoder 1; and server 4 which controls coding modes of the MPEG encoder 1 and the MPEG decoder 2 and which also controls live transmission addresses. These elements are communicably connected. Note that MPEG decoders 2-1, 2-2, . . . will be simply called "MPEG decoder 2" unless discrimination thereamong is necessary.

In the present system, the server 4 sets a coding mode (MPEG 1/2/4, coding bit rate, the presence/absence of audio data, and so on) and live transmission addresses to the MPEG encoder 1. The server 4 also sets live receiving addresses and a threshold for use in deciding whether or not a retransmission request should be immediately sent.

The MPEG encoder 1 is installed at a remote place, which is, for example, a place where an object to be monitored in a monitoring system is present. The MPEG encoder 1 encodes input videos using the coding mode set by the server 4, and sends the encoded MPEG streaming data and redundant packets (FEC packets) for data correction to the addresses set by the server 4. The MPEG decoder 2 and the client 3 decodes/replays the MPEG streaming data while performing error correction, thereby making it possible to perform remote video monitoring.

Figure 2:
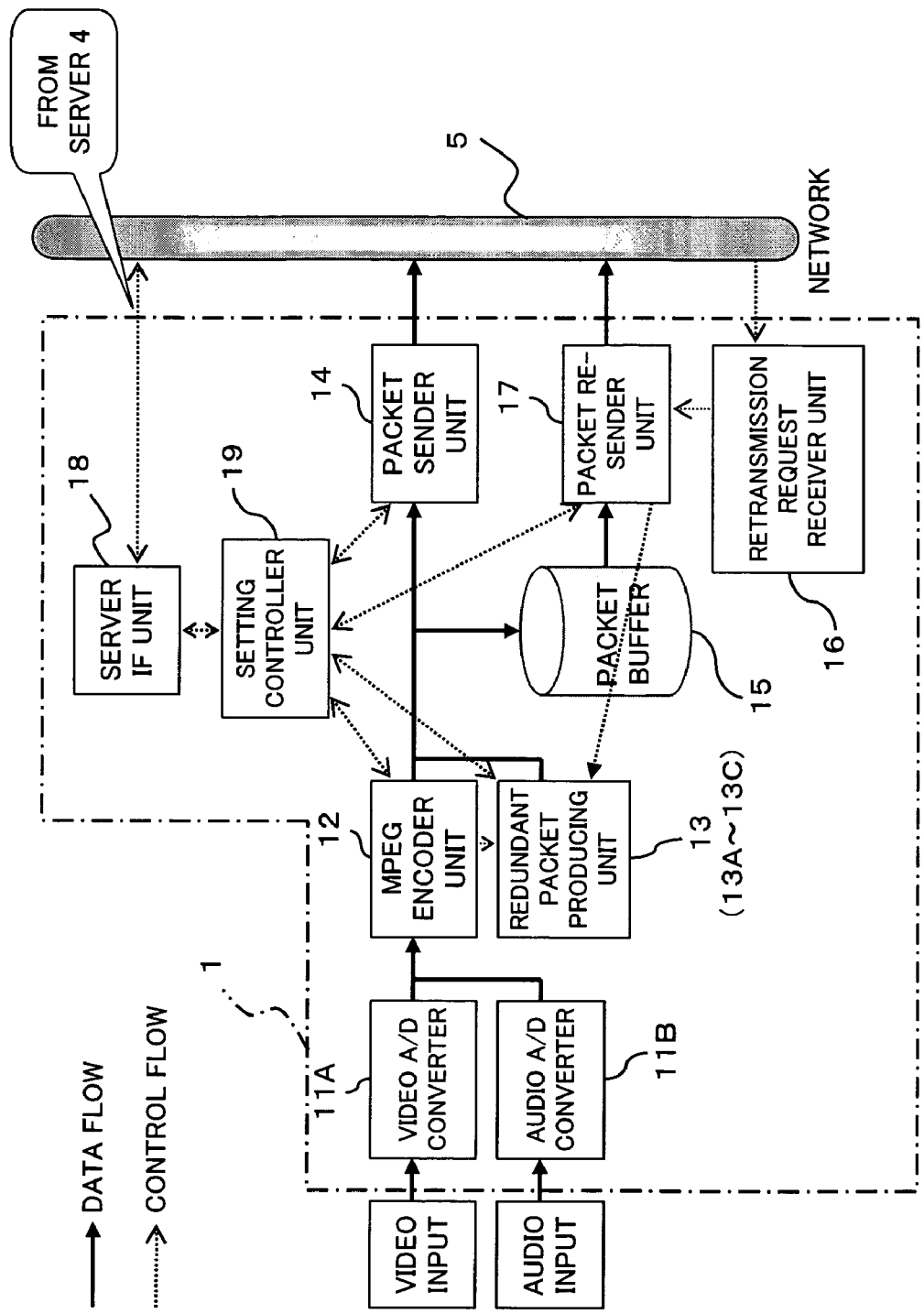
FIG. 2 is a block diagram showing an essential part of an MPEG encoder of FIG. 1.
Figure 3:
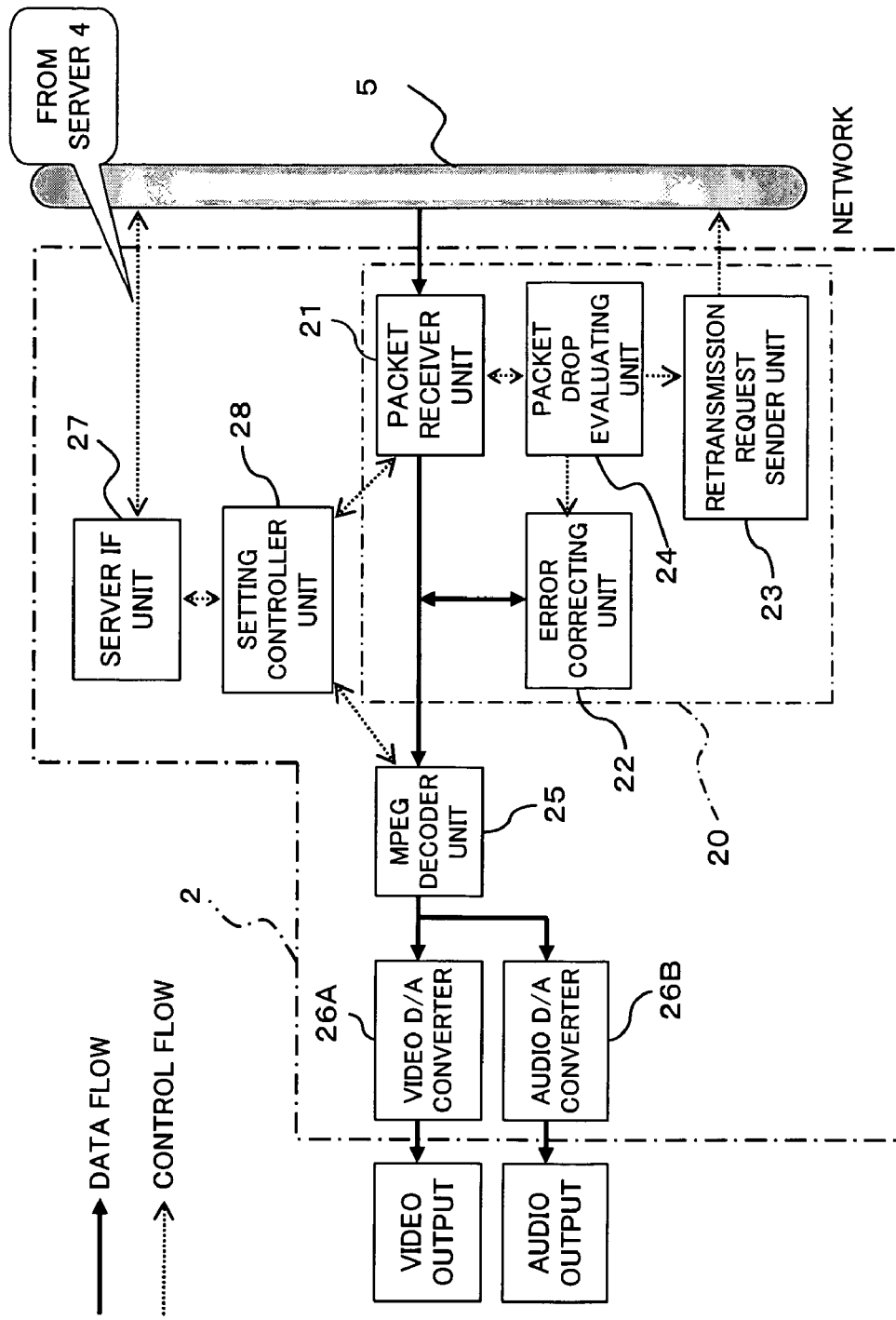
FIG. 3 is a block diagram showing an essential part of the MPEG decoder of FIG. 1.

The MPEG encoder 1 has a construction such as that of FIG. 2, while the MPEG decoder 2 has a construction such as that of FIG. 3. The application of the present invention does not necessitate any special construction of the MPEG encoder 1, and the MPEG encoder 1 just needs to have a function to resend a requested packet in response to a retransmission request (this means that the MPEG encoder 1 supports ARQ).

(A1) MPEG Encoder 1

As shown in FIG. 2, an essential part of the MPEG encoder 1 is formed by video analogue/digital (A/D) converter 11A, audio analogue/digital (A/D) converter 11B, MPEG encoder unit 12, redundant packet producing unit 13, packet sender unit 14, packet buffer 15, retransmission request receiver unit 16, packet re-sender unit 17, server interface (IF) unit 18, and setting controller unit 19.

The video A/D converter 11A converts an video (analogue signal) input from a video camera or the like into a digital signal. The audio A/D converter 11B converts audio (analogue signal) input into a digital signal. The MPEG encoder unit 12 performs MPEG coding of the digital video/audio signal input from the video A/D converter 11A and 11B, and the MPEG encoder unit 12 also packetizes the encoded MPEG streaming data.

The redundant packet generating unit (error correction data generating apparatus) 13 generates redundant packets (parities) for error correction, based on the MPEG streaming data encoded by the MPEG encoder unit 12, and the redundant packet producing unit 13 has functions as:

(1) a cumulative exclusive-OR calculation unit 13A, which starts calculating cumulative exclusive-OR of transmission data [MPEG packets (also called "media packets")] at the operation start point, and continues the calculation regardless of time duration [a redundant packet generation rate (that is, an insertion interval)] which is necessary for producing a redundant packet;

(2) a memory (data receiver apparatus-specific storing means) 13B, which stores master redundant packets (FEC values) for each decoder 2, for difference calculation, when the master redundant packet is sent to each decoder 2 (and client 3), the master redundant packets (FEC values) being calculations obtained by the above calculation unit 13A; and (3) an exclusive-OR insertion time point calculating unit 13C, which produces the next redundant packet by calculating exclusive-OR only once at the time the next redundant packet is transmitted to one of the decoders 2 (or client 3), the exclusive-OR being calculated between the master redundant packet (FEC value) at the time of the transmission and the previous master redundant packet (FEC value) stored in the memory 13B.

The function (all or a part thereof) of the redundant packet producing unit 13 is realized by a computer (encoder 1), such as a CPU, by executing a specific application program (error correction data generating program). The program may be recorded in a computer-readable recording medium such as a flexible disc, CD-ROM, CD-R, CD-RW, MO, and DVD. The operation of the redundant packet producing unit 13 will be detailed later with reference to FIG. 5 and FIG. 7.

The packet sender unit 14 packetizes MPEG streaming data obtained from the MPEG encoder unit 12, and sends (distributes) the packets, together with the packets from the redundant packet producing unit 13, to the network 5.

The packet buffer 15 temporarily holds the sent-out MPEG packets (copy packets) for a specific time in case of packet retransmission in response to a packet retransmission request. The retransmission request receiver unit 16 receives a retransmission request from the MPEG decoder 2 via the network 5. When the retransmission request receiver unit 16 receives such a retransmission request, the packet re-sender unit 17 reads out a requested MPEG packet from the packet buffer 15, and sends the read-out packet to the MPEG decoder 2 which originates the retransmission request.

The server IF unit 18 interfaces between the MPEG encoder 1 and the network 5, so as to receive setting information and control information from the server 4 via the network 5. The setting controller unit 19, which controls the operation of the whole of the MPEG encoder 1, performs setting and controlling of the MPEG encoder unit 12, the redundant packet producing unit 13, the packet sender unit 14, and the packet re-sender unit 17, in response to the setting information and the control information received by the server IF unit 18 from the server 4.

More specifically, as for the apparatus setting, the setting controller unit 19 interprets the setting information, such as a coding mode, live transmission address, redundant packet generation rate (interval), and retransmission packet holding duration, received from the server 4 by the server IF unit 18. The setting controller unit 19 sets the coding mode to the MPEG encoder unit 12, the live transmission address to the packet sender unit 14, the redundant packet generation rate (default value) to the redundant packet producing unit 13, the retransmission packet holding duration to the packet buffer 15.

As a result, in the MPEG encoder 1, after the video A/D converters 11A and 11B convert the input video/audio into digital form, the MPEG encoder unit 12 encodes the digital data in the coding mode set by the server 4. After that, the redundant packet producing unit 13 generates redundant packets (parities) for the MPEG packets, based on exclusive-OR, at a rate set by the server 4. The packet sender unit 14 sends the generated redundant packet, together with the MPEG packets, to the network 5.

At that time, the MPEG encoder 1 holds the sent-out MPEG packet in the packet buffer 15 in case of a retransmission request from an MPEG decoder 2. If the retransmission request receiver unit 16 receives a retransmission request from the MPEG decoder 2, packets the MPEG decoder 2 requests are taken out from the packet buffer 15, and are then sent out by the packet re-sender unit 17 to the network 5. At the same time, the redundant packet producing unit 13 is instructed to extend the interval at which a redundant packet is generated (inserted) to be sent to the decoder 2 (or client 3), so that the transmission rate of all the data is kept constant. That is, MPEG encoder 1 (redundant packet producing unit 13) of the present embodiment carries a function as an insertion interval changing means, which changes the redundant packet generation (insertion) interval in response to a packet retransmission request from a decoder 2 (or a client 3), so that the transmission rate of all the data is kept constant.

(A-2) MPEG Decoder 2

As shown in FIG. 3, the essential part of an MPEG decoder 2 (or a client 3) has an error correcting device 20 including a packet receiver unit 21, error correcting unit 22, retransmission sender unit 23, and packet drop evaluating unit 24. The MPEG decoder 2 also has an MPEG decoder unit 25, video digital/analogue (D/A) converter 26A, audio digital/analogue (D/A) converter 26B, server IF unit 27, and setting controller unit 28.

The packet receiver unit 21 receives packets, transmitted from the MPEG encoder 1, through the network 5. The error correcting unit 22 performs error correction (FEC), when any packet drop (packet loss) occurs, based on the next redundant packet received by the packet receiver unit 21. The occurrence of the packet loss is recognized by monitoring RTP packet numbers (sequence numbers) (described later).

The retransmission sender unit 23 is instructed by the packet drop evaluating unit 24 to send a retransmission request to the MPEG encoder 1. The packet drop evaluating unit (packet drop detector unit, retransmission request controller unit) 24 detects packet drop (packet loss) in packets received by the packet receiver unit 21. If any packet loss is detected, the packet drop evaluating unit 24 sends a retransmission request for the lost packet to the MPEG encoder 1. Here, the retransmission request may be sent immediately, or alternatively, the request transmission timing may be controlled according to whether or not the error correcting unit 22 is capable of restoring the lost packet within a specific time. For example, even if packet loss occurs, a redundant packet can be received soon after that, where error correction is available utilizing FEC. Thus, the time the next redundant packet arrives is obtained based on intervals at which redundant packets are transmitted, and on the basis of the result, the timing with which a retransmission request is sent out by the retransmission sender unit 23 is controlled (changed).

The MPEG decoder unit 25 performs MPEG-decoding of the received MPEG streaming data in a decoding mode corresponding to the coding mode employed on the sender end (MPEG encoder 1). The video D/A converter 26A converts the MPEG-decoded digital video data, decoded by the MPEG decoder unit 25, into analogue form and outputs the analogue data to an video display apparatus such as a monitor. The audio D/A converter 26B converts the MPEG-decoded digital audio data, decoded by the MPEG decoder unit 25, into analogue form and outputs the analogue audio data to a audio output apparatus such as a speaker.

The server IF unit 27 interfaces between the MPEG decoder 2 and the network 5. Similar to the MPEG encoder 1, the server IF unit 27 receives setting information and control information from the server 4 via the network 5. The setting controller unit 28 performs setting and controlling of the packet receiver unit 21 and the MPEG decoder unit 25 according to the setting information and control information received by the server IF unit 27.

As for the apparatus setting, the setting controller unit 28 interprets a live receiving address received by the server IF unit 27 from the server 4, and sets the address to the packet receiver unit 21. Packets received by the packet receiver unit 21 are evaluated in terms of whether or not any packet loss occurs therein. If no packet loss is found, the MPEG decoder unit 25 performs MPEG-decoding of the packets, and the video D/A converter 26A and the audio D/A converter 26B replays the video and audio.

On the other hand, when the packet drop evaluating unit 24 recognizes any packet loss, the MPEG decoder unit 25 does not perform MPEG-decoding immediately, and it waits for the next redundant packet to arrive, before the error correcting unit 22 performs error correction (FEC). Alternatively, the retransmission sender unit 23 sends a retransmission request to the MPEG encoder 1, and the MPEG decoder unit 25 waits for the lost packet to be received before executing MPEG decoding.

A description will be made hereinbelow of an operation of the system of the present embodiment, in particular, of a process for generating a redundant packet.

Figure 4A:
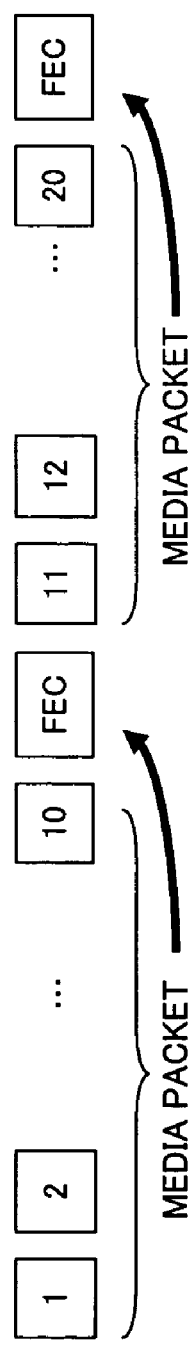
FIG. 4(A) through FIG. 4(C) are views each showing production (insertion) of redundant packets for an individual MPEG decoder.

First of all, referring to FIG. 4, a description will be made of a process for generating redundant packets at different intervals for individual decoders 2. Such redundant packets are generated by cumulatively calculating exclusive-OR of media packets transmitted for a specific time duration. As shown in FIG. 4(A), for example, since one redundant packet per 10 media packets is to be sent to decoder 2-1, exclusive-OR of media packets 1 through 10 is normally calculated to generate a redundant packet, and then, exclusive-OR of media packets 11 through 20 is calculated to generate the next redundant packet, and the process is similarly repeated. In this manner, an individual redundant packet is calculated from corresponding media packets transmitted during a time duration required to generate the redundant packet.

Figure 4B:
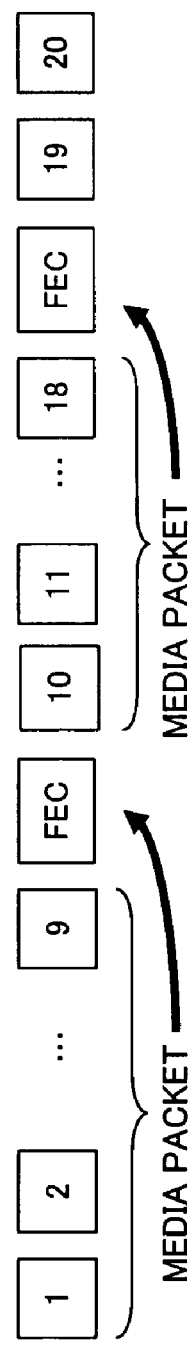
Figure 4C:
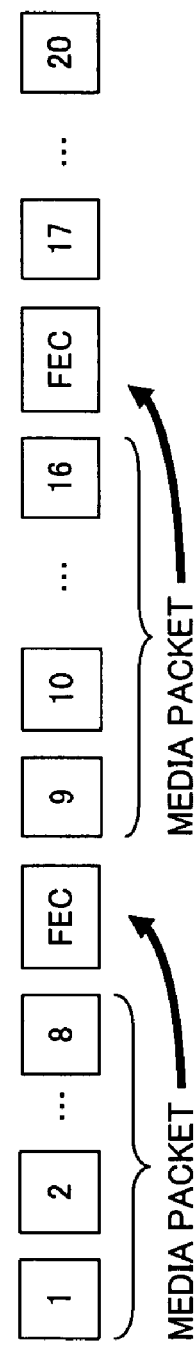

Provided that such redundant packets are transmitted to two or more decoders, 2-1, 2-2, and 2-3, at different insertion intervals, as shown in FIG. 4(A) through FIG. 4(C), exclusive-OR needs to be calculated separately for each decoder. For example, if redundant packets are transmitted at the same intervals to all of the decoders 2-1, 2-2, and 2-3, 60 (=20×3)-time exclusive-OR operation needs to be performed to generate two redundant packets for the respective decoders, 2-1, 2-2, and 2-3. Assuming that the insertion intervals for decoders 2-2 and 2-3 are changed, so that the insertion intervals for decoders 2-1, 2-2, and 2-3, are "10", "9", and "8", respectively, 20 (=10×2) times of exclusive-OR operations, 18 (=9×2) times of exclusive-OR operations, and 16 (=8×2) times of exclusive-OR operations, are required to generate two redundant packets for the individual decoders 2-1, 2-2, and 2-3, respectively. Hence, a total sum of 54 (=20+18+16) times of exclusive-OR operations are required to be performed.

Figures 5A, 5B, 5C, 5D:
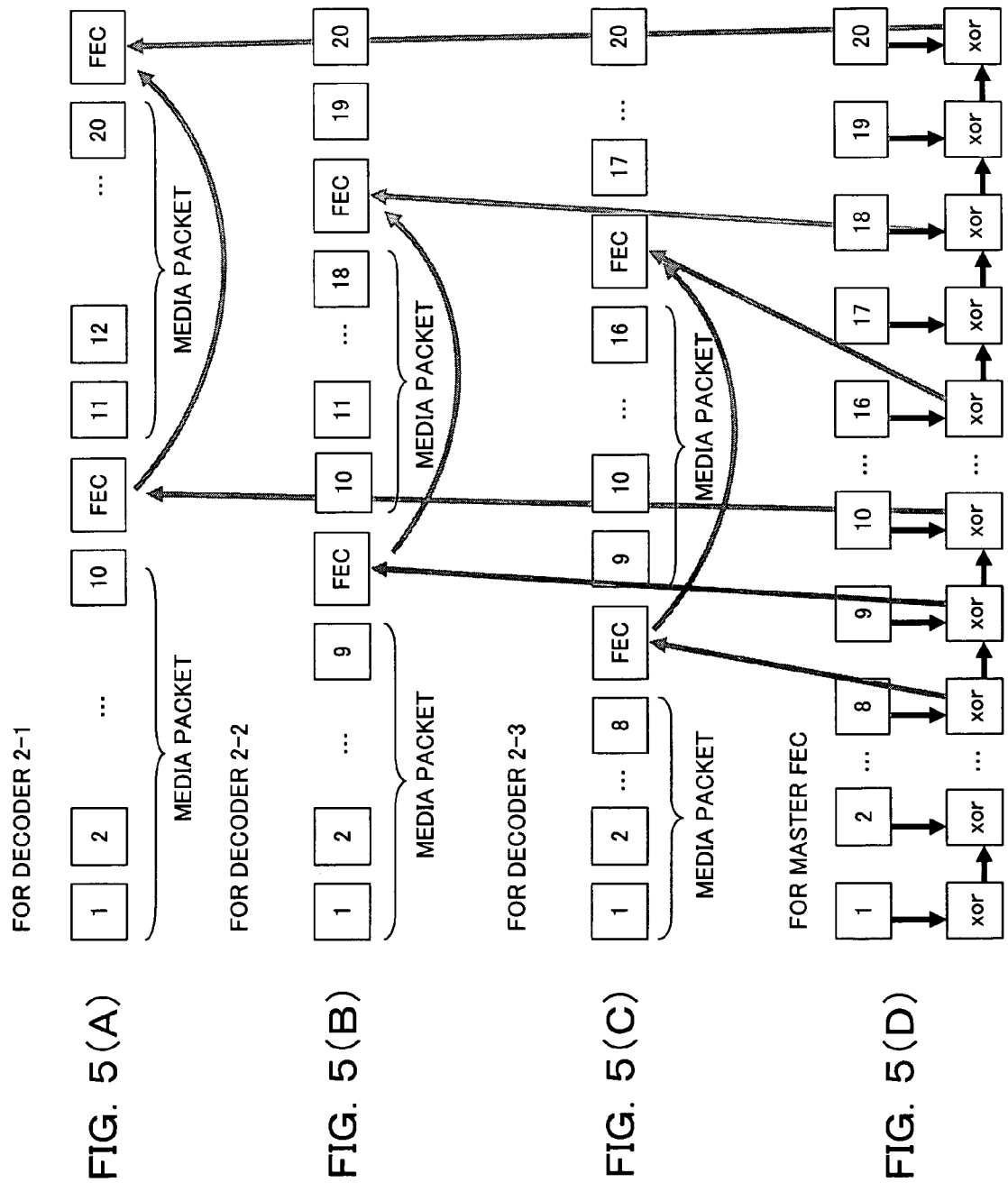
FIG. 5(A) through FIG. 5(D) are views each showing production of redundant packets according to the present embodiment.

For the purpose of reducing the number of times of exclusive-OR operations so as to decrease processing load, the following arrangements are performed in the present embodiment. As shown in FIG. 5(D), for example, the redundant packet producing unit 13 starts calculation of cumulative exclusive-OR of media packets at the operation start point and continuously calculates the cumulative exclusive-OR independently of the time required to generate redundant packets. As a result, master redundant packets (FEC packets) are obtained. Since redundant packets are generated by exclusive-OR operation, exclusive-OR from N to M is obtained by exclusive-OR between $FEC_N$ and $FEC_M$, where $FEC_N$ is exclusive-OR from 1 to N; $FEC_M$ is exclusive-OR from 1 to M.

Accordingly, when a redundant packet is sent to an individual decoder, a master redundant packet at that moment is held for difference calculation. Then, when the next redundant packet is transmitted, exclusive-OR between a master redundant packet at this moment and the above master redundant packet having been held is calculated. A redundant packet is resultantly generated, by performing exclusive-OR operation only once.

As shown in FIG. 5(A) and FIG. 5(D), a calculation (master FEC value) of cumulative exclusive-OR of media packets 1 through 10 is transmitted, as the first redundant packet, to decoder 2-1, and the master FEC value is stored. At the time (the scheduled insertion time) of transmission of the next redundant packet, exclusive-OR between a FEC value calculated at this time and the previous master FEC value having been stored is calculated, thereby generating the next redundant packet.

Likewise, as shown in FIG. 5(B) and FIG. 5(D), a master FEC value of media packets 1 through 9 is transmitted, as the first redundant packet, to decoder 2-2, and the master FEC value is also stored. At the time of transmission of the next redundant packet, exclusive-OR between a FEC value calculated at this time and the previous master FEC value having been stored is calculated, thereby generating the next redundant packet. In addition, as shown in FIG. 5(C) and FIG. 5(D), a master FEC value of media packets 1 through 8 is transmitted, as the first redundant packet, to decoder 2-3, and the master FEC value is also stored. At the time of transmission of the next redundant packet, exclusive-OR between a FEC value calculated at this time and the previous master FEC value having been stored is calculated, thereby generating the next redundant packet.

Accordingly, 20 times of exclusive-OR operations for master redundant packets (master FEC values) and 6 (=2×3) times of exclusive-OR operations for decoders 2, that is, a total sum of 26 times of exclusive-OR operations need to be performed, to transmit (insert) separate redundant packets to two or more decoders 2. In this manner, the number of times the operations are performed is decreased, so that load of the redundant packet generation process is greatly reduced.

Figure 6:
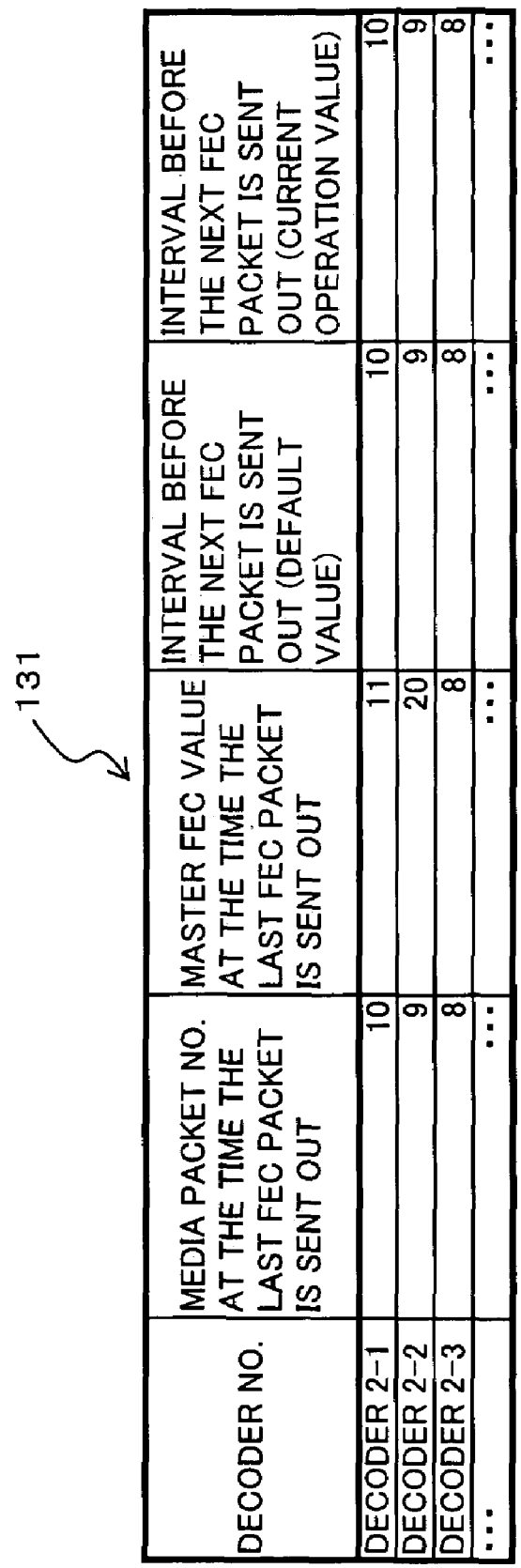
FIG. 6 is a table indicating an example of redundant packet transmission management table according to the present embodiment.

For the purpose of realizing such an operation, the redundant packet producing unit 13 has an FEC packet transmission management table 131 of FIG. 6, which table stores "the media packet number at the time the last redundant packet is sent out" and "FEC value at the time the last redundant packet is sent out" for each decoder 2. The FEC packet transmission management table 131 is stored and managed, as table-formed data, in memory (storing means) 13B such as a RAM.

As shown in FIG. 6, "the interval before the next FEC packet is sent out" is managed in the table 131. A default setting value and a current operation value of the interval is managed for each decoder 2. The default setting value is set by the server 4, for example, and is stored in the setting controller unit 19 via the server IF unit 18.

This default value depends on the band of the network 5 and the MPEG encoding rate, or the like. The current operation value is updated to change the FEC packet insertion interval when an ARQ retransmission packet is transmitted. As an example, if one ARQ retransmission packet is transmitted, the FEC packet transmission interval is so set as to double the default value (that is, transmission of one redundant packet is refrained from) This value is updated before a decision is made as to "whether or not an FEC packet should be transmitted to decoder 2-k" (will be described later with reference to FIG. 7), and is used as a condition for making the decision.

The following table 1 shows an example of FEC values. FEC value calculation is normally a packet-based calculation, but for the convenience of description, the example is made assuming that each packet is one-byte information.

TABLE 1

Example FEC Values

| Packet No. | Data Value | FEC Value for Decoder 2-1 | FEC Value for Decoder 2-2 | FEC Value for Decoder 2-3 | Calculation of master FEC |
|---|---|---|---|---|---|
| 1 | 4 | 4 | 4 | 4 | 4 |
| 2 | 7 | 3 | 3 | 3 | 3 |
| 3 | 10 | 9 | 9 | 9 | 9 |
| 4 | 13 | 4 | 4 | 4 | 4 |
| 5 | 16 | 20 | 20 | 20 | 20 |
| 6 | 19 | 7 | 7 | 7 | 7 |
| 7 | 22 | 17 | 17 | 17 | 17 |
| 8 | 25 | 8 | 8 | | 8 |
| 9 | 28 | 20 | | 28 | 20 |
| 10 | 31 | | 31 | 3 | 11 |
| 11 | 34 | 34 | 61 | 33 | 41 |
| 12 | 37 | 7 | 24 | 4 | 12 |
| 13 | 40 | 47 | 48 | 44 | 36 |
| 14 | 43 | 4 | 27 | 7 | 15 |
| 15 | 46 | 42 | 53 | 41 | 33 |
| 16 | 49 | 27 | 4 | | 16 |
| 17 | 52 | 47 | 48 | | 36 |
| 18 | 55 | 22 | | | 19 |
| 19 | 58 | 34 | | | 41 |
| 20 | 61 | | | | 20 |

The shaded areas in Table 1 indicate when FEC packets are sent out. For decoder 2-1, FEC packets are sent out when the media packet number is "10" and "20", and the FEC values at those times are "11" and "31", respectively. With the normal calculation method of FIG. 5, the FEC value (=31) when the packet number is "20" is obtained by cumulatively calculating exclusive-OR from the packet number "11" through the packet number "20". In contrast to this, on the redundant packet producing unit 13 of the present embodiment, the FEC value (=31) when the packet number is "20" is obtained by exclusive-OR between the master FEC value (=11) when the packet number is "10" and the master FEC value (=20) when the packet number is "20".

Likewise, for decoder 2-2, FEC packets are sent out when the media packet number is "9" and "18", and the FEC values at those times are "20" and "7", respectively. The FEC value (=7) when the packet number is "18" is obtained by exclusive-OR between the master FEC value (=20) when the packet number is "9" and the master FEC value (=20) when the packet number is "18". In addition, for decoder 2-3, FEC packets are sent out when the media packet number is "8" and "16", and the FEC values at those times are "8" and "24", respectively. The FEC value (=24) when the packet number is "16" is obtained by exclusive-OR between the master FEC value (=8) when the packet number is "8" and the master FEC value (=16) when the packet number is "16".

Here, in the exclusive-OR operation, (0, 0)→0, (0, 1)→1, (1, 0)→1, (1, 1)→0. That is, when bit-based exclusive-OR operation is performed, if bit value "1" appears an odd number of times, the result is "1", and if bit value "1" appears an even number of times, the result is "1". The following table 2 indicates whether an odd number or an even number of "1"s appear from time k to time N, master FEC calculations at the time of packet k and at the time of packet N, whether an odd or an even number of "1"s appear from time k+1 through N, and the FEC calculation at the time of packet k+1 through N.

TABLE 2

Exclusive-OR Operation Example

| The number of bit "1"s from 0 to k | Master FEC calculation at packet k | The number of bit "1"s from 0 to N | Master FEC Calculation at packet N | The number of bit "1"s from k + 1 to N | FEC Calculation from k + 1 to N |
|---|---|---|---|---|---|
| Even | 0 | Even | 0 | Even | 0 |
| Even | 0 | Odd | 1 | Odd | 1 |
| Odd | 1 | Even | 0 | Odd | 1 |
| Odd | 1 | Odd | 1 | even | 0 |

Table 2 indicates that the result (FEC calculation from k+1 to N) of exclusive-OR from k+1 to N coincides with the result of exclusive-OR between the master FEC calculation at packet k and the master FEC calculation at packet N.

Figure 7:
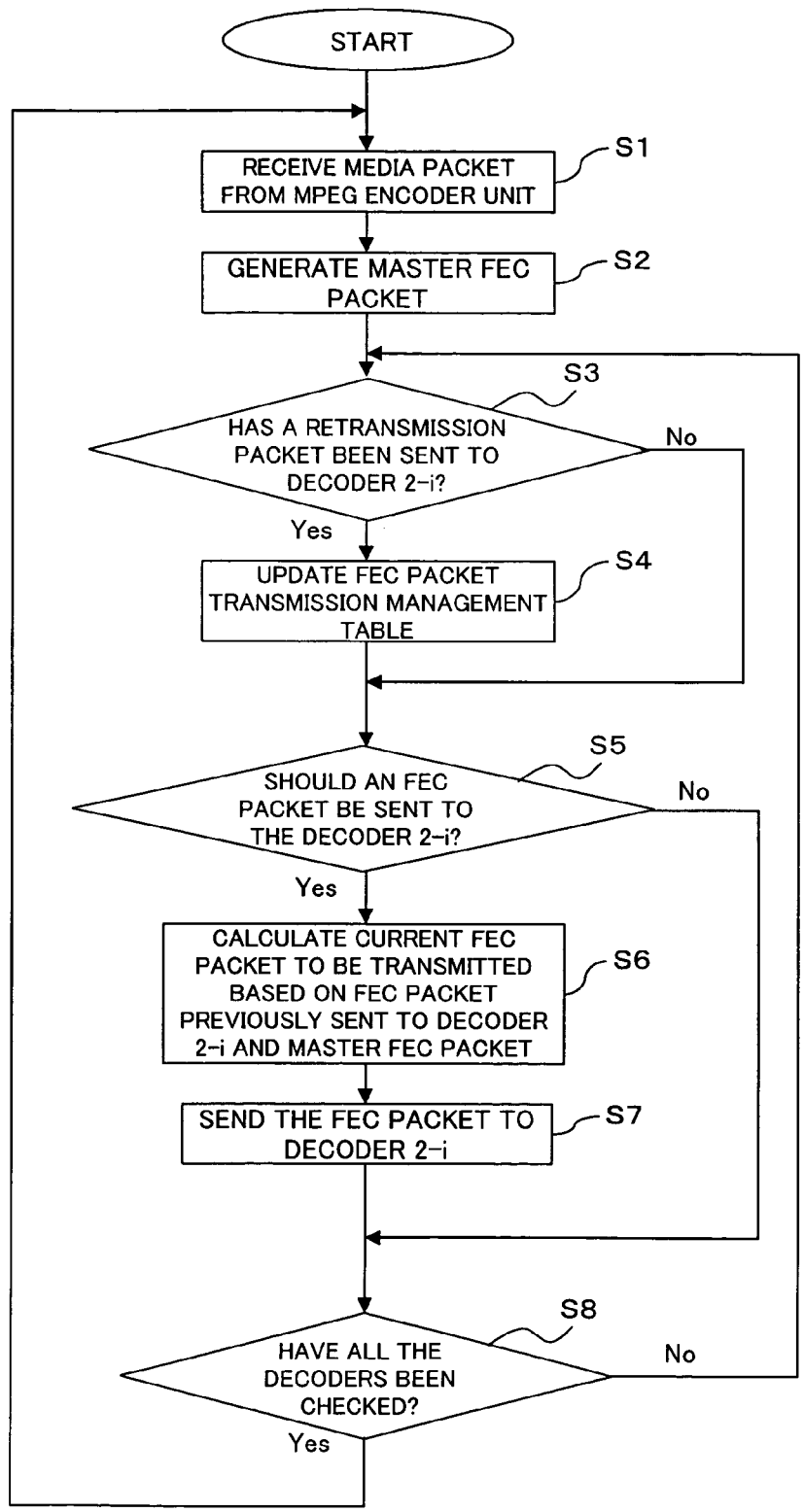
FIG. 7 is a flow chart indicating a process of producing a redundant packet.
Figure 8:
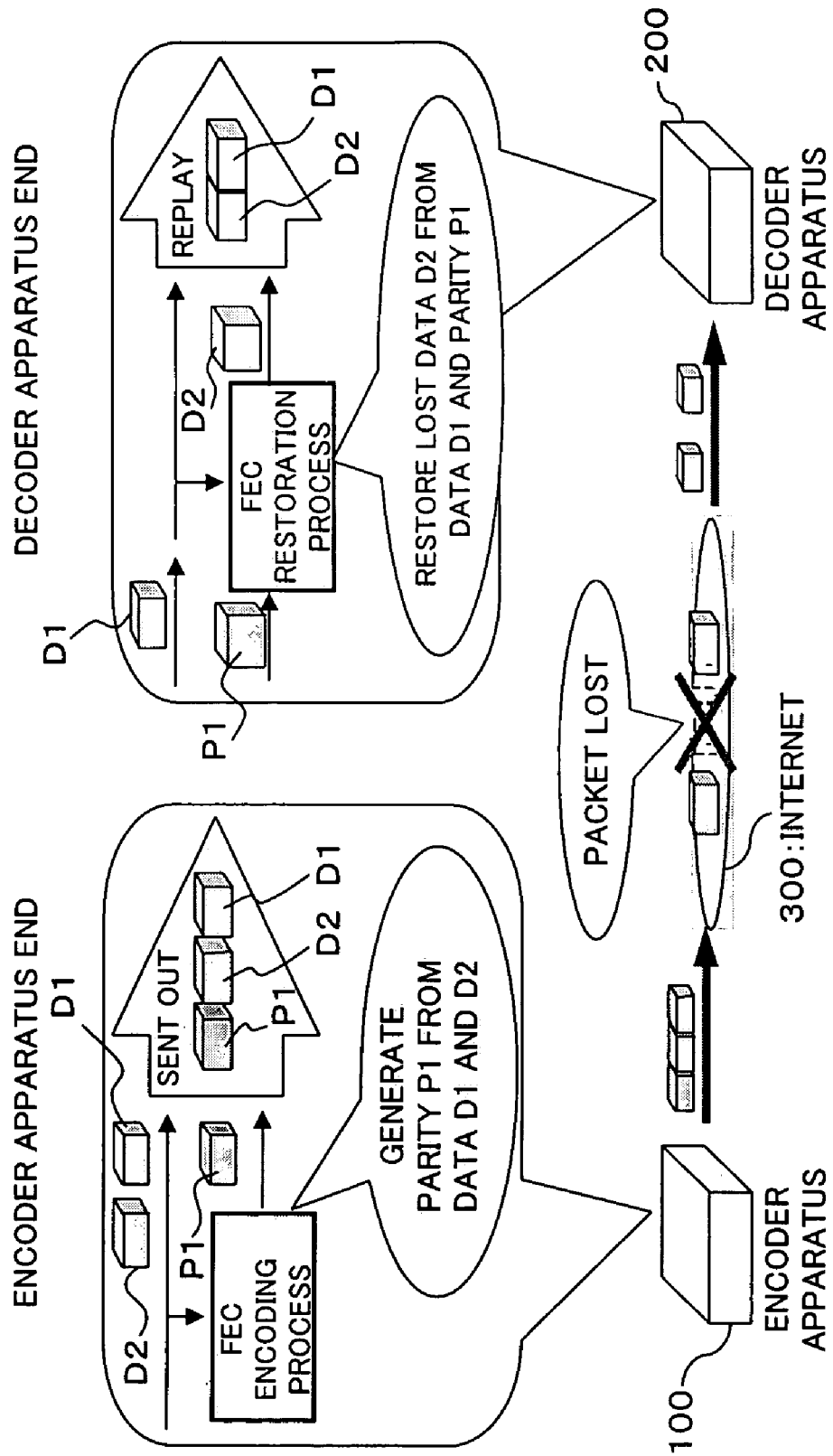
FIG. 8 is a view describing a previous error correction method utilizing FEC.
Figure 9:
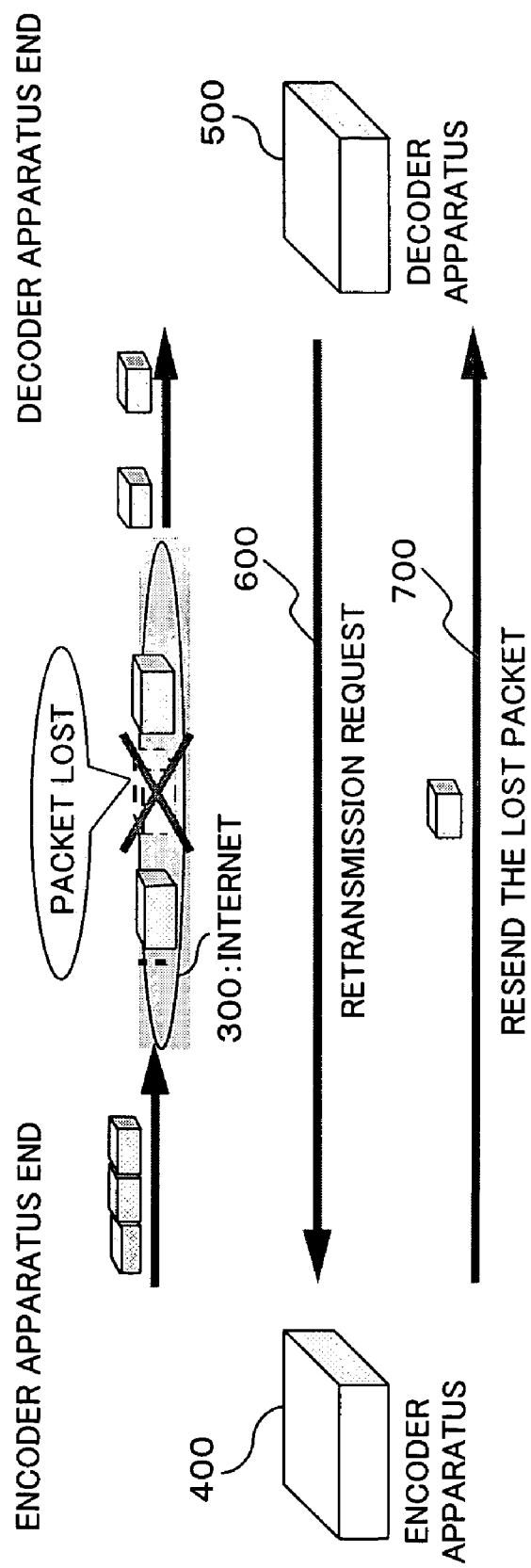
FIG. 9 is a view describing a previous error correction method utilizing ARQ.

Next, referring to FIG. 7, a description will be made of an operation of MPEG encoder 1 (redundant packet producing unit 13) which realizes the above redundant packet generating method.

The MPEG encoder 1 (redundant packet producing unit 13) initiates its operation at the time a media packet is received from the MPEG encoder unit 12 (step S1), and the MPEG encoder 1 continues cumulatively calculating exclusive-OR every time a media packet is received, to generate master redundant packets (step S2).

During this time, if a retransmission request is received from decoder 2-i (i=1, 2, 3, . . . ), the redundant packet producing unit 13 checks whether or not the packet re-sender unit 17 has sent out a required packet (step S3). If the retransmission has been performed, "the interval (current operation value) before the next FEC packet is sent out" in the aforementioned FEC packet transmission management table 131 is updated (YES route of step S3 and step S4), and whether it is the timing to transmit an FEC packet to decoder 2-i is also checked (step S5). Here, if no packet retransmission has been performed, the aforementioned current operation value is not updated, and whether it is the timing to transmit an FEC packet to decoder 2-i is checked (NO route of step S3 and step S5). Whether it is the timing to transmit an FEC packet is evaluated for each destination decoder 2-i separately, based on the FEC packet transmission interval given by the server 4 and on how many times the packet re-sender unit 17, which receives the retransmission request from decoder 2-i via the retransmission request receiver unit 16, instructed to change the transmission interval.

As a result, if evaluated that it is the timing to transmit an FEC packet, the redundant packet producing unit 13 refers to FEC packet transmission management table 131, and performs an exclusive-OR operation between the master FEC packet (FEC calculation) that was transmitted to decoder 2-i previously (last time) and the master FEC packet (FEC calculation) at the present time, to calculate/generate an FEC packet to be transmitted at the present time (step S6), and the present FEC packet is sent out via the packet sender unit 14 (step S7). When an FEC packet is transmitted to decoder 2-i for the first time, exclusive-OR between a master FEC calculation at the time of initiation of media packet transmission and the current master FEC calculation is calculated, to generate/transmit an FEC packet. In addition, the master FEC calculation at the time the FEC packet is sent is stored in the table 131 for calculation performed when the next FEC packet is sent.

Until all the decoders 2-i are checked (until step S8 makes a YES decision), the foregoing processes (step S3 and the steps thereafter) are repeated (NO route of step S8). If the checking is completed, the foregoing step S1 and the steps thereafter are performed once again (YES route of step S8), whereby FEC packets are generated for the individual decoders 2-i (which are receiving the video) separately.

This makes it possible to perform FEC packet calculation for two or more decoders 2-i, independent of the difference in insertion interval among the decoders 2-i and of the presence or absence of changing in the insertion interval. That is, it is possible to generate/insert necessary FEC packets without the necessity of performing cumulative exclusive-OR operation separately for each object decoder 2 (depending on the packet insertion intervals), and thus, load of generating FEC packets is greatly reduced. Further, since the FEC packet insertion interval is changed in response to a retransmission request, the data transmission band can be kept uniform, so that efficient error correction is available.

The present invention should by no means be limited to the above embodiment, and various changes or modifications may be suggested without departing from the gist of the invention.

For example, although the above example employs both of the FEC and ARQ error correction methods, the present invention is also applicable to data transmission apparatus which employ only the FEC method. Further, in the above example, data is transmitted to two or more destinations, and FEC packet insertion intervals are changed so that the intervals are different among the destinations. However, the present invention is also applicable to where the insertion intervals are unchangeable and the same among the destinations, and load of calculating exclusive-OR for FEC packet generation is greatly reduced.

Further, although streaming data (media packets) is transmitted in the above example, the present invention is also applicable where other types of data are transmitted, and like effects to those of the above embodiment are realized.

As already described, in the present invention, exclusive-OR of transmission data is cumulatively calculated, independent of error correction data insertion intervals, and exclusive-OR between the exclusive-OR at the time of insertion of the previous error correction data and the exclusive-OR at the scheduled time of insertion of the present error correction packet is calculated, to generate error correction data to be currently inserted. This makes it possible to calculate error correction data independently of the difference or changes in error correction data insertion interval, so that load of the calculation is greatly reduced. This invention is thus greatly useful in the field of information communication technology.

What is claimed is:

1. An error correction data generating method for generating error correction data, which is to be inserted into transmission data at specific insertion intervals, by calculating exclusive-OR of the transmission data, said method comprising:
    cumulatively calculating exclusive-OR of the transmission data, said calculation being continuously performed independent of the insertion intervals; and
    computing exclusive-OR between a calculation of the exclusive-OR obtained at the previous insertion occasion of the error correction data and a calculation of the exclusive-OR obtained at the scheduled time of the current insertion of the error correction data, to generate error correction data to be inserted at the present insertion occasion.

2. An error correction data generating method as set forth in claim 1, wherein, when the transmission data is sent to a plurality of data receiver apparatus, and when the error correction data is inserted into the transmission data at insertion intervals unique to each of the destination receiver apparatus,
    a calculation of the exclusive OR obtained at the previous insertion occasion is stored separately for each of the plural data receiver apparatus, and
    for each of the plural data receiver apparatus, exclusive-OR between the calculation of the exclusive-OR obtained at the previous insertion occasion of the error correction data and a calculation of the exclusive-OR obtained at the scheduled time of the current insertion of the error correction data, is computed to generate error correction data to be inserted at the present insertion occasion.

3. An error correction data generating method as set forth in claim 2, wherein, the insertion intervals are changed in response to a retransmission request for the transmission data.

4. An error correction data generating method as set forth in claim 1, wherein, the insertion intervals are changed in response to a retransmission request for the transmission data.

5. An error correction data generating apparatus for generating error correction data, which is to be inserted into transmission data at specific insertion intervals, by calculating exclusive-OR of the transmission data, said apparatus comprising:
    an exclusive-OR cumulative calculation unit which cumulatively calculates exclusive-OR of the transmission data, said calculation being continuously performed independent of the insertion intervals;
    a storing means which stores a calculation obtained by said exclusive-OR cumulative calculation unit at the previous data insertion occasion, and
    an exclusive-OR insertion time point computing means which computes exclusive-OR between a calculation obtained by said exclusive-OR cumulative calculation unit at the scheduled time of the current insertion of the error correction data and the calculation which is obtained at the previous insertion occasion of the error correction data and is stored in said storing means, to generate error correction data to be inserted at the present insertion occasion.

6. An error correction data generating apparatus as set forth in claim 5, wherein, when the transmission data is sent to a plurality of data receiver apparatus, and when the error correction data is inserted into the transmission data at insertion intervals unique to each of the destination receiver apparatus,
    said storing means is provided as a data receiver apparatus-specific storing means which stores a calculation of the exclusive OR, obtained at the previous insertion occasion, separately for each of the plural data receiver apparatus, and
    said exclusive-OR insertion time point computing means is provided as a means which computes, for each of the plural data receiver apparatus, exclusive-OR between the calculation, which is obtained at the previous insertion occasion of the error correction data and is stored in said data receiver apparatus-specific storing means, and a calculation obtained by said exclusive-OR cumulative calculation means at the scheduled time of the current insertion of the error correction data.

7. An error correction data generating apparatus as set forth in claim 5, further comprising an insertion interval changing apparatus which changes the insertion intervals in response to a retransmission request for the transmission data.

8. An error correction data generating apparatus as set forth in claim 6, further comprising an insertion interval changing apparatus which changes the insertion intervals in response to a retransmission request for the transmission data.

9. A computer-readable recording medium in which is recorded a program for instructing a computer to generate error correction data, which is to be inserted into transmission data at specific insertion intervals, by calculating exclusive-OR of the transmission data, said program instructing the computer to execute the steps of:
    cumulatively calculating exclusive-OR of the transmission data, said calculation being continuously performed independent of the insertion intervals; and
    computing exclusive-OR between a calculation of the exclusive-OR obtained at the previous insertion occasion of the error correction data and a calculation of the exclusive-OR obtained at the scheduled time of the current insertion of the error correction data, to generate error correction data to be inserted at the present insertion occasion.

* * * * *

UNITED STATES PATENT AND TRADEMARK OFFICE
CERTIFICATE OF CORRECTION

| | |
|---|---|
| PATENT NO. | : 7,320,099 B2 |
| APPLICATION NO. | : 10/994343 |
| DATED | : January 15, 2008 |
| INVENTOR(S) | : Tsuyoshi Miura et al. |

It is certified that error appears in the above-identified patent and that said Letters Patent is hereby corrected as shown below:

Col. 15, line 31, delete "exclusive OR" and insert --exclusive-OR--, therefor.

Col. 16, line 18, delete "exclusive OR" and insert --exclusive-OR--, therefor.

Signed and Sealed this

Tenth Day of June, 2008

JON W. DUDAS
*Director of the United States Patent and Trademark Office*